United States Patent
Lin et al.

(10) Patent No.: US 8,927,412 B1
(45) Date of Patent: Jan. 6, 2015

(54) MULTI-CHIP PACKAGE AND METHOD OF FORMATION

(71) Applicant: Taiwan Semiconductor Manufacturing Company, Ltd., Hsin-Chu (TW)

(72) Inventors: Jing-Cheng Lin, Hsin-Chu (TW); Chen-Hua Yu, Hsin-Chu (TW); Jui-Pin Hung, Hsin-Chu (TW); Der-Chyang Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/956,601

(22) Filed: Aug. 1, 2013

(51) Int. Cl.
  *H01L 21/56* (2006.01)
  *H01L 23/498* (2006.01)
  *H01L 23/00* (2006.01)

(52) U.S. Cl.
  CPC .......... *H01L 23/49811* (2013.01); *H01L 21/56* (2013.01); *H01L 24/11* (2013.01)
  USPC .................................................. 438/613

(58) Field of Classification Search
  CPC ................... H01L 21/56; H01L 23/49811
  USPC .................................................. 438/613
  See application file for complete search history.

(56) References Cited

U.S. PATENT DOCUMENTS

2014/0131856 A1* 5/2014 Do et al. ................ 257/737

* cited by examiner

*Primary Examiner* — Tran Tran
(74) *Attorney, Agent, or Firm* — Slater & Matsil, L.L.P.

(57) ABSTRACT

A device comprises a first semiconductor die embedded in a molding compound layer, a surface-mount device embedded in the molding compound layer, a plurality of interconnect structures formed on the molding compound layer, wherein the first semiconductor die is electrically coupled to the interconnect structures and the surface-mount device is electrically coupled to the interconnect structures through at least a metal pillar and a plurality of bumps formed on and electrically coupled to the interconnect structures.

20 Claims, 9 Drawing Sheets

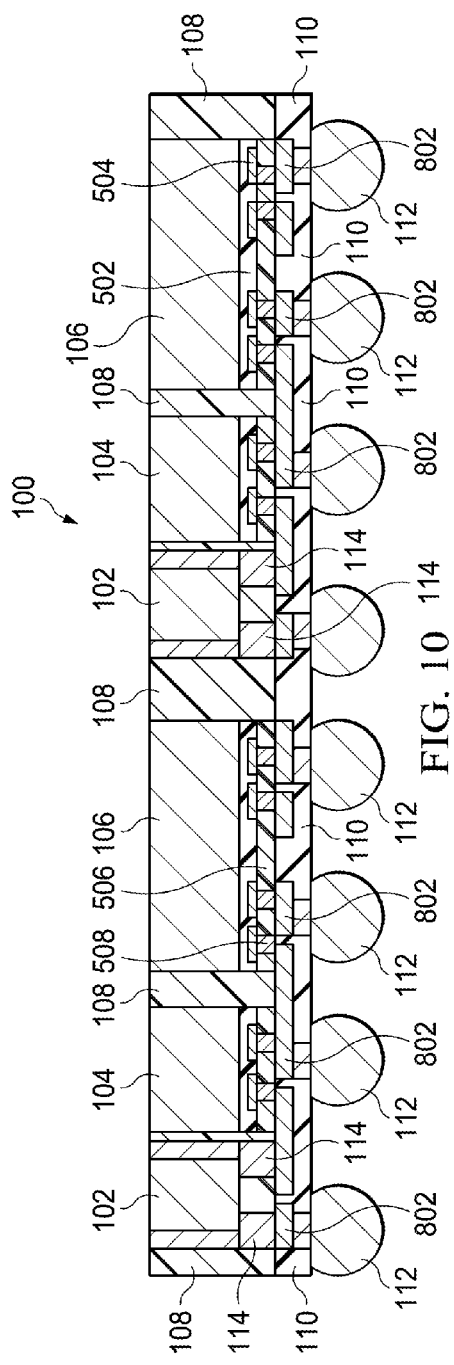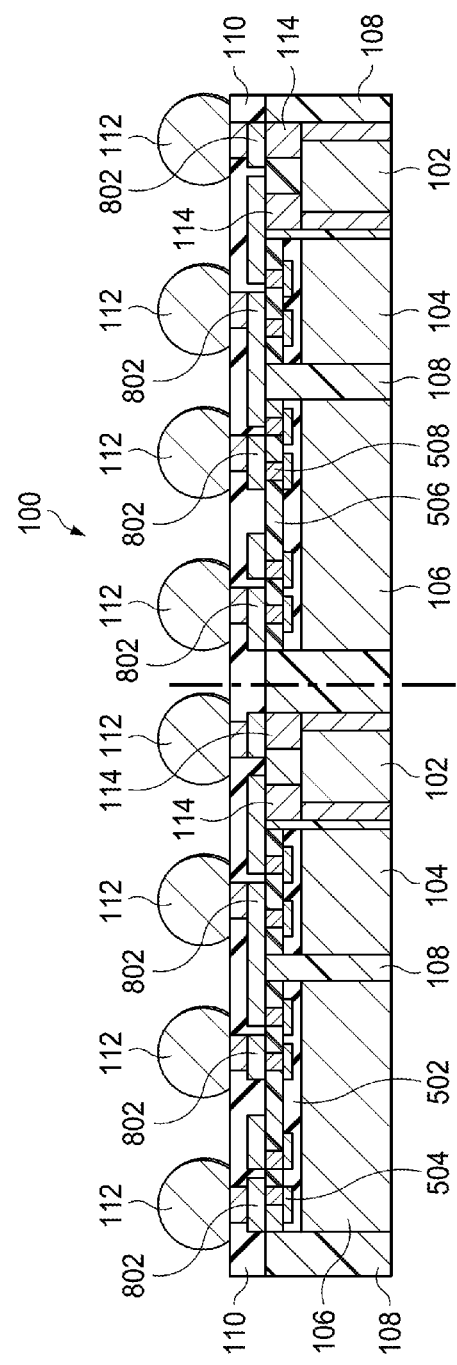

US 8,927,412 B1

MULTI-CHIP PACKAGE AND METHOD OF FORMATION

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies evolve, wafer level package based semiconductor devices have emerged as an effective alternative to further reduce the physical size of a semiconductor chip. There may be two signal routing mechanisms in a wafer level package based semiconductor device, namely a fan-in signal routing mechanism and a fan-out signal routing mechanism. In a semiconductor device having a fan-in signal routing mechanism, input and output pads of each die are limited to an area within the footprint of the semiconductor die. With the limited area of the die, the number of the input and output pads is limited due to the limitation of the pitch of the input and output pads.

In a semiconductor device having a fan-out signal routing mechanism, the input and output pads of a die can be redistributed to an area outside the area of the die. As such, the input and output pads can spread signals to a larger area than the area of the die and provide additional space for interconnects. As a result, the number of input and output pads of the semiconductor device can be increased.

In a fan-out structure, the signal redistribution can be implemented by using a redistribution layer. The redistribution layer may couple an input and output pad within the area of the die and another input and output pad outside the area of the die so that signals from the semiconductor die can be spread outside the footprint of the semiconductor die.

A molding compound layer may be formed over the semiconductor die. The molding compound layer may be formed of epoxy based resins and the like. A portion of the molding compound layer located from the edge of the die to the edge of the semiconductor device is commonly referred to as a fan-out area of the semiconductor device.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 10 illustrates a process of removing the carrier from package-to-package semiconductor device in accordance with various embodiments of the present disclosure; and FIG. 11 illustrates a cross sectional view of the semiconductor device shown in FIG. 10 after a dicing process is applied to the semiconductor device in accordance with various embodiments of the present disclosure.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a multi-chip semiconductor device including a surface-mount device. The embodiments of the disclosure may also be applied, however, to a variety of semiconductor devices. Hereinafter, various embodiments will be explained in detail with reference to the accompanying drawings.

Figure 1:
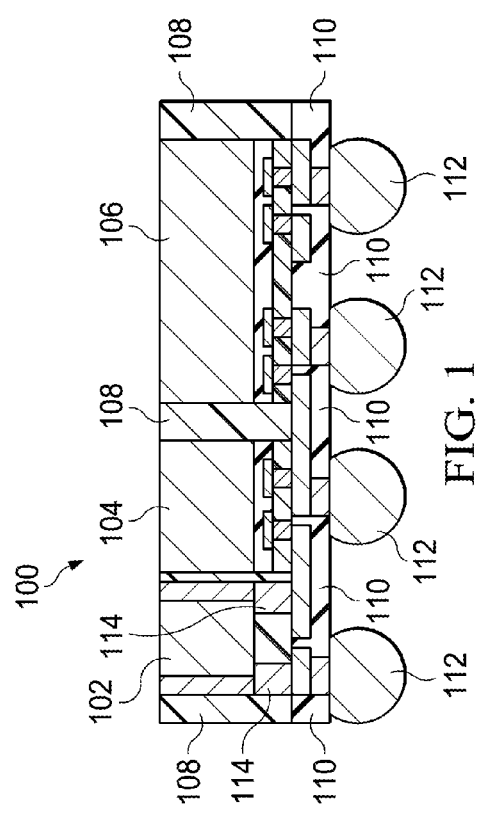
FIG. 1 illustrates a cross sectional view of a multi-chip semiconductor device in accordance with various embodiments of the present disclosure.

FIG. 1 illustrates a cross sectional view of a multi-chip semiconductor device in accordance with various embodiments of the present disclosure. The multi-chip semiconductor device 100 may include a first semiconductor die 104, a second semiconductor die 106 and a surface-mount device 102. As shown in FIG. 1, the first semiconductor die 104, the second semiconductor die 106 and the surface-mount device 102 are placed on a first side of an interconnect structure 110 and embedded in a molding compound layer 108. In particular, the top surface of the surface-mount device 102 is level with the top surfaces of the first semiconductor die 104 and the second semiconductor die 106. In some embodiments, the top surfaces of the first semiconductor die 104, the second semiconductor die 106 and the surface-mount device 102 are exposed outside the molding compound layer 108 as shown in FIG. 1.

A plurality of bumps 112 is formed on a second side of the interconnect structure 110. There may be a plurality of under bump metallization (UBM) structures formed underneath the bumps 112. The detailed formation processes of the bumps 112 and the UBM structures will be described below with respect to FIG. 9.

The surface-mount device 102 has two contacts, which are electrically coupled to the interconnect structure 110 through two metal pillars 114. The detailed formation process of the metal pillars 114 will be described below with respect to FIG. 4.

The first semiconductor die 104 and the second semiconductor die 106 are electrically connected to the interconnect structure 110. The input/output terminals such as copper vias of the semiconductor dies 104 and 106 are in direct contact with the interconnect structure 110. This configuration of the semiconductor dies 104, 106 and the interconnect structure 110 is different from conventional multi-chip semiconductor devices having a plurality of bumps such as micro bumps coupled between a semiconductor die and a bottom package. The detailed process of connecting the semiconductor dies 104 and 106 with the interconnect structure 110 will be described below with respect to FIG. 8.

It should be noted that the number of semiconductor dies (e.g., semiconductor dies 104 and 106) and surface-mount devices (e.g., surface-mount device 102) shown in FIG. 1 is merely an example. There may be many variations, modification and alternatives. For example, a person skilled in the art will recognize that the multi-chip semiconductor device 100 may accommodate any number of semiconductor dies and surface-mount devices.

It should further be noted that the molding compound layer 108 shown in FIG. 1 is merely an example. One person skilled in the art will recognize there may be many variations, modifications and alternatives. For example, the molding compound layer 108 may be formed of a variety of suitable materials. In addition, the height of the molding compound layer 108 may vary depending on a variety of applications and different design needs.

FIGS. 2-11 illustrate intermediate steps of fabricating the multi-chip semiconductor device shown in FIG. 1 in accordance with various embodiments of the present disclosure. It should be noted that the fabrication steps as well as the multi-chip package structure shown in FIGS. 2-11 are merely an example. A person skilled in the art will recognize there may be many alternatives, variations and modifications.

Figure 2:
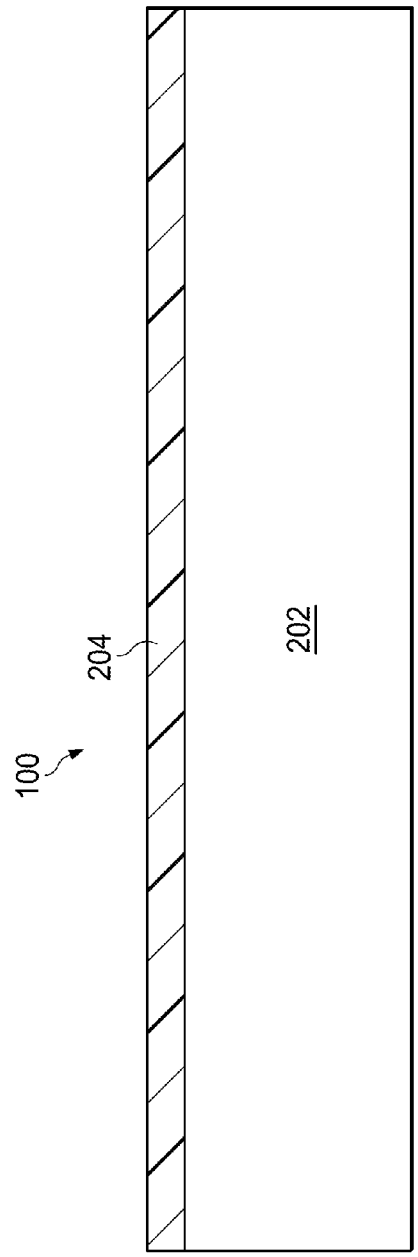
FIG. 2 illustrates a cross sectional view of a carrier in accordance with various embodiments of the present disclosure.

FIG. 2 illustrates a cross sectional view of a carrier in accordance with various embodiments of the present disclosure. A carrier 202 may be employed to prevent a thin wafer (e.g., semiconductor die 104 shown in FIG. 1) of a multi-chip semiconductor device from cracking, warping, breaking and the like.

A release layer (not shown) is formed on top of the carrier 202. The release layer may be formed of suitable materials such as polymer and/or the like. The release layer may be UV-curable. In some embodiments, the release layer may be formed on the carrier 202 through suitable semiconductor fabrication processes such as spin-coating.

An adhesive layer 204 may be spin-coated on the release layer. The adhesive layer 204 may be formed of suitable materials such as polymer and/or the like. In alternative embodiments, the adhesive layer 204 may be suitable tapes such as die attach film (DAF), non-conductive film (NCF) and/or the like. The adhesive layer 204 may be removed by using chemical solvent, chemical mechanical polishing (CMP) and/or the like.

Figure 3:
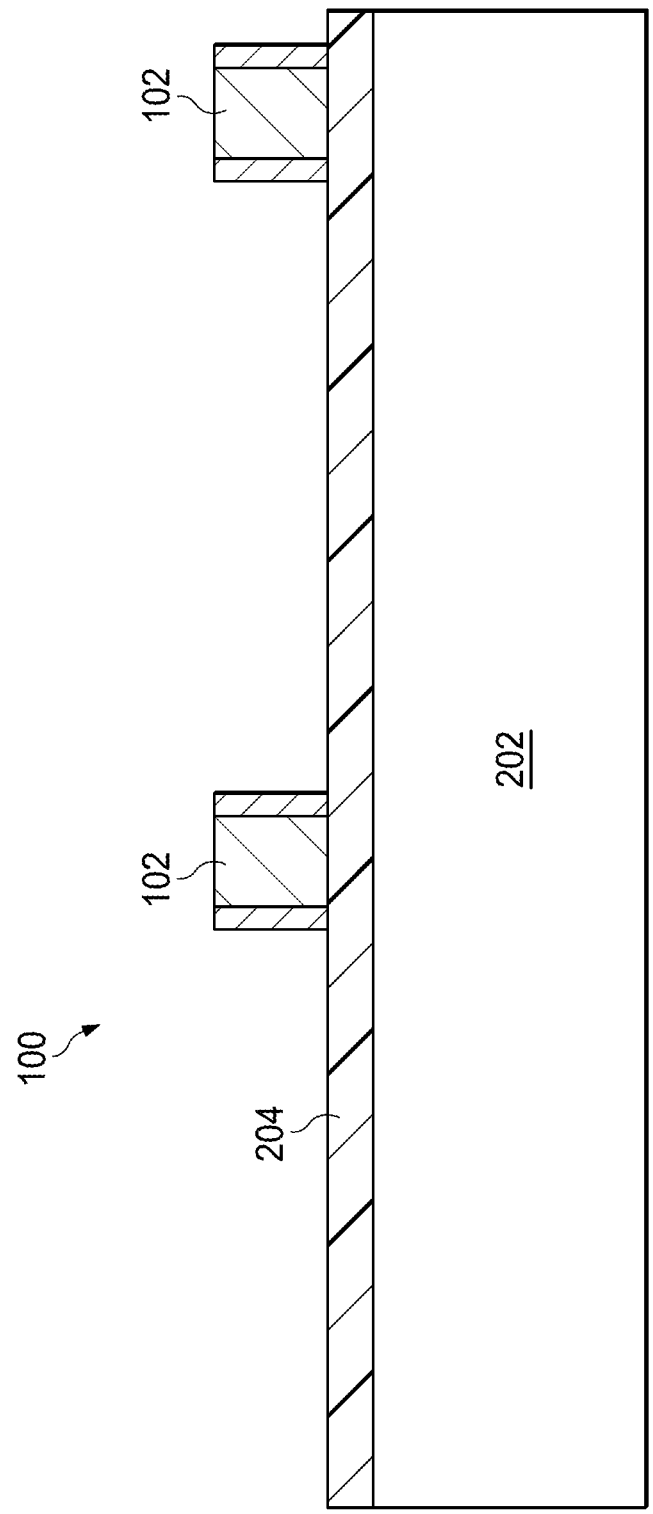
FIG. 3 illustrates a cross sectional view of the semiconductor device shown in FIG. 2 after a plurality of surface-mount devices are mounted on the carrier in accordance with various embodiments of the present disclosure.

FIG. 3 illustrates a cross sectional view of the semiconductor device shown in FIG. 2 after a plurality of surface-mount devices are mounted on the carrier in accordance with various embodiments of the present disclosure. The surface-mount devices 102 are picked and placed on top of the carrier 202. The surface-mount devices are bonded on the carrier 202 through the adhesive layer 204.

The surface-mount device 102 may be a passive component such as a capacitor, a resistor, an inductor, any combinations thereof and/or the like. As shown in FIG. 3, the surface-mount device 102 may include two contacts formed of conductive materials such as solder and/or the like.

Figure 4:
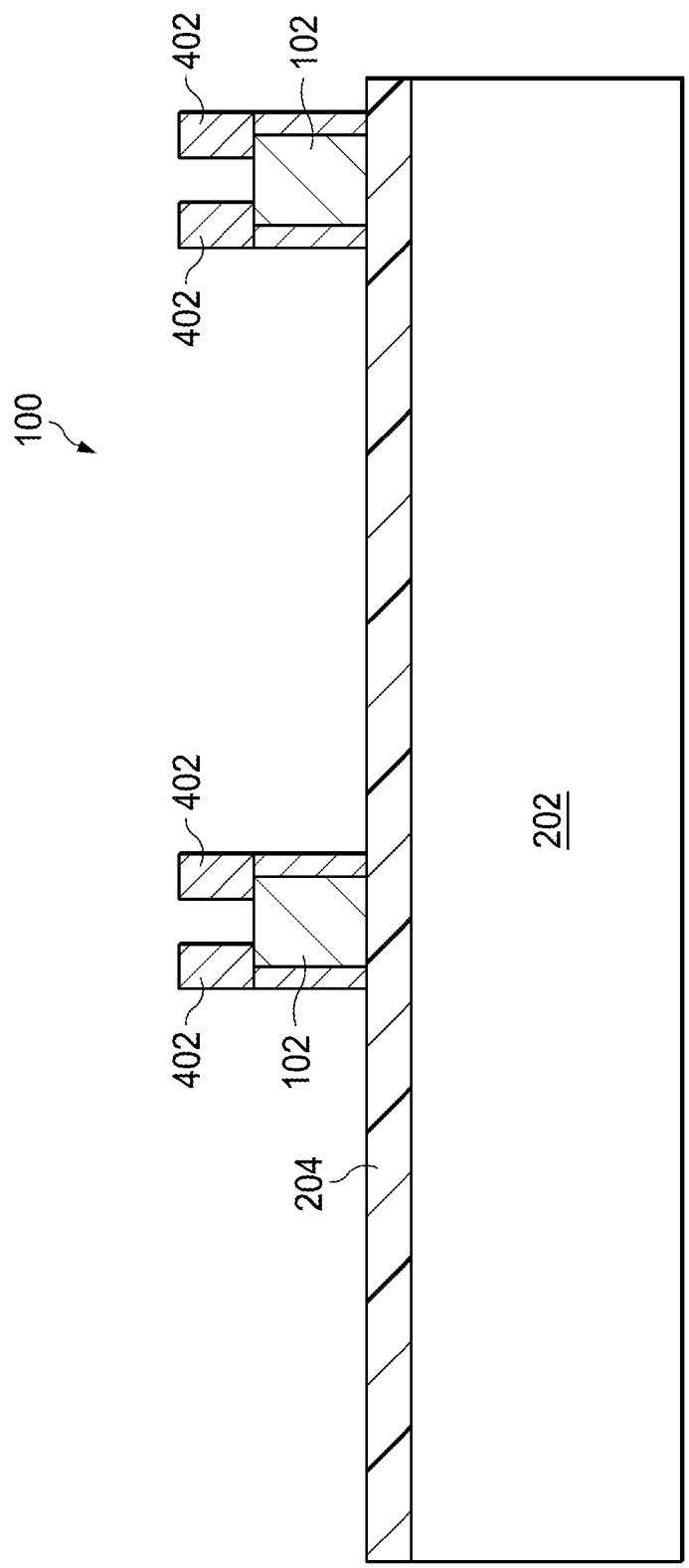
FIG. 4 illustrates a cross sectional view of the semiconductor device shown in FIG. 3 after a metal-paste printing process is applied to the surface-mount devices in accordance with various embodiments of the present disclosure.

FIG. 4 illustrates a cross sectional view of the semiconductor device shown in FIG. 3 after a metal-paste printing process is applied to the surface-mount devices in accordance with various embodiments of the present disclosure. According to the locations of the contacts of the surface-mount devices 102, a stencil may be employed to print the metal paste on top of the contacts of the surface-mount devices 102. A reflow process is applied to the semiconductor device so that the metal paste may coalesce into metal pillars 402 on top of the contacts of the surface-mount devices 102.

In accordance with some embodiments, the metal pillars 402 may be formed of suitable materials such as solder, copper, aluminum, nickel, tin, silver, any combinations thereof and/or the like.

Alternatively, the metal pillars 402 may be formed by disposing a photo resist layer over the carrier 202, patterning the photo resist layer to form a plurality of pillar-shaped openings over the contacts of the surface-mount devices 102, filling the openings with suitable materials such as solder and the like, reflowing the solder materials and removing the photo resist layer to expose the metal pillars 402.

Figure 5:
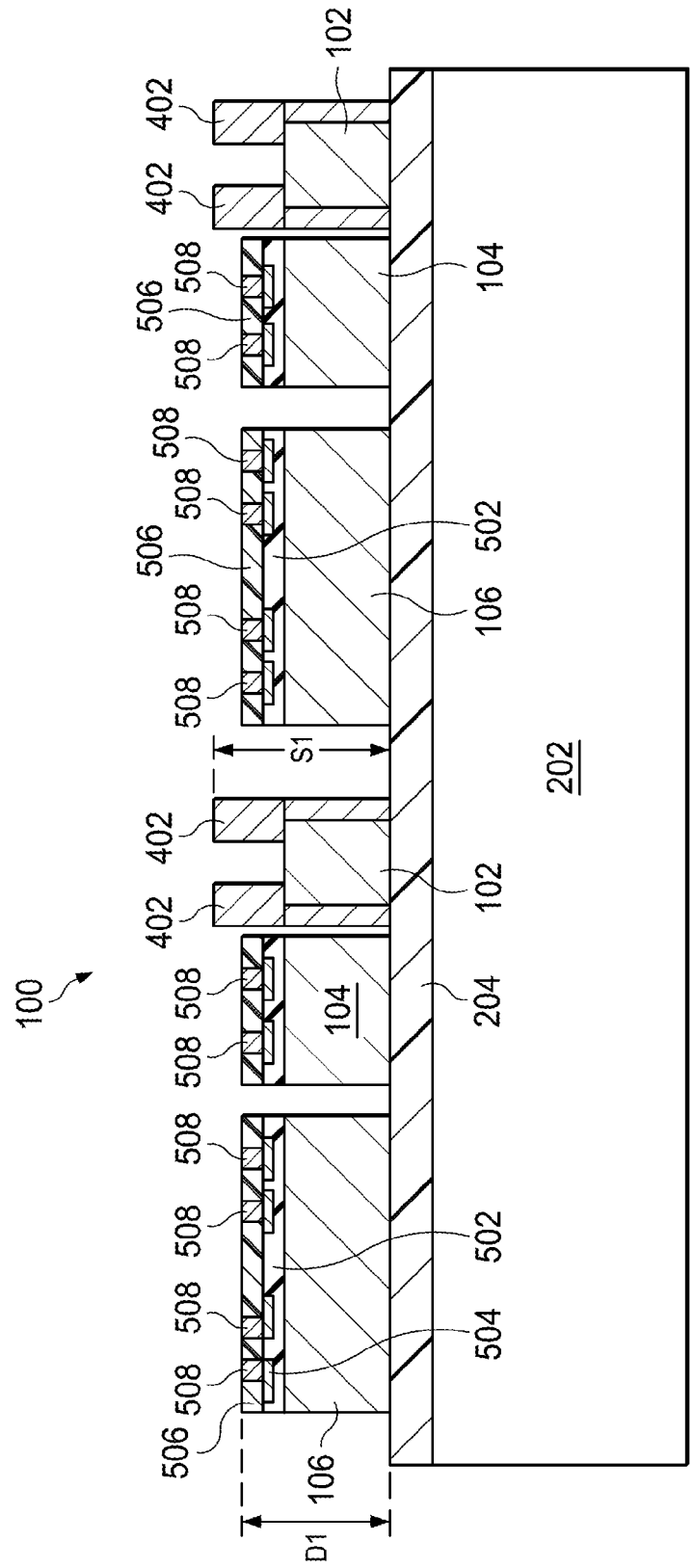
FIG. 5 illustrates a cross sectional view of the semiconductor device shown in FIG. 4 after a plurality of semiconductor dies are mounted on the carrier in accordance with various embodiments of the present disclosure.

FIG. 5 illustrates a cross sectional view of the semiconductor device shown in FIG. 4 after a plurality of semiconductor dies are mounted on the carrier in accordance with various embodiments of the present disclosure. The semiconductor dies 104 and 106 are picked and placed on top of the carrier 202. The semiconductor dies are bonded on the carrier 202 through the adhesive layer 204.

As shown in FIG. 5, in accordance with some embodiments, the semiconductor dies (e.g., dies 104 and 106) and surface-mount devices (e.g., surface-mount device 102) are divided into two groups. Each group includes two semiconductor dies and one surface-mount device.

The semiconductor dies 104 and 106 may be from a same semiconductor wafer. More particularly, a suitable dicing process may be employed to separate the semiconductor wafer (not shown) into a plurality of individual chip packages (e.g., semiconductor dies 104 and 106). Alternatively, semiconductor dies 104 and 106 may be from two different semiconductor wafers. In particular, these two semiconductor wafers may be of a same height. As a result, as shown in FIG. 5, the first semiconductor die 104 has a height approximately equal to that of the second semiconductor die 106.

It should be noted that the top surface of the metal pillar 402 is higher than the top surfaces of the semiconductor dies 104 and 106. The height of the top surfaces of the surface-mount devices 102 is defined as S1 as shown in FIG. 5. Likewise, the height of the semiconductor dies 104 and 106 is defined as D1. In some embodiments, S1 is greater than or equal to D1.

In order to give a basic insight of the inventive aspects of various embodiments, the semiconductor dies (e.g., semiconductor dies 104 and 106) are drawn without details. However, it should be noted that the semiconductor dies 104 and 106 may comprise basic semiconductor layers such as active circuit layers, substrate layers, inter-layer dielectric (ILD) layers and inter-metal dielectric (IMD) layers (not shown respectively).

The semiconductor dies 104 and 106 may comprise a substrate. The substrate may be formed of silicon, silicon germanium, silicon carbide or the like. Alternatively, the substrate may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates and the like.

The substrate may further comprise a variety of electrical circuits (not shown). The electrical circuits formed on the substrate may be any type of circuitry suitable for a particular application.

In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

A passivation layer 502 is formed over the substrate. The passivation layer 502 is formed of non-organic materials such as un-doped silicate glass, silicon nitride, silicon oxide, silicon oxynitride, boron-doped silicon oxide, phosphorus-doped silicon oxide and/or the like. Alternatively, the passivation layer 502 may be formed of low-k dielectric such as carbon doped oxide and/or the like. In addition, extremely low-k (ELK) dielectrics such as porous carbon doped silicon dioxide can be employed to form the passivation layer 502. The passivation layer 502 may be formed through any suitable techniques such as chemical vapor deposition (CVD) and the like.

As shown in FIG. 5, there may be a plurality of metal pads 504. As shown in FIG. 5, the metal pads 504 are embedded in the passivation layer 502. The metal pads 504 may be made of metallic materials such as copper, copper alloys, aluminum, silver, gold and any combinations thereof, and/or multi-layers thereof. The metal pads 504 may be formed by suitable techniques such as CVD. Alternatively, the metal pads 504 may be formed by sputtering, electroplating and/or the like.

A first polymer layer 506 is formed on the top of the passivation layer 502 in accordance with an embodiment. The first polymer layer 506 is formed on top of the passivation layer 502. The first polymer layer 506 may be made of polymer materials such as epoxy, polyimide, polybenzoxazole (PBO), silicone, benzocyclobutene (BCB), molding compounds and/or the like. In accordance with an embodiment, the first polymer layer 506 may be formed of PBO. The first polymer layer 506 may be made by suitable deposition methods known in the art such as spin coating.

As shown in FIG. 5, there may be a plurality of vias 508 formed in the first polymer layer 506. The vias 508 are coupled to the electrical circuits in the substrate through the metal pads 504. The vias 508 are filled with conductive materials such as copper and/or the like. The vias 508 may be formed by using suitable fabrication processes such as plating and/or the like.

Figure 6:
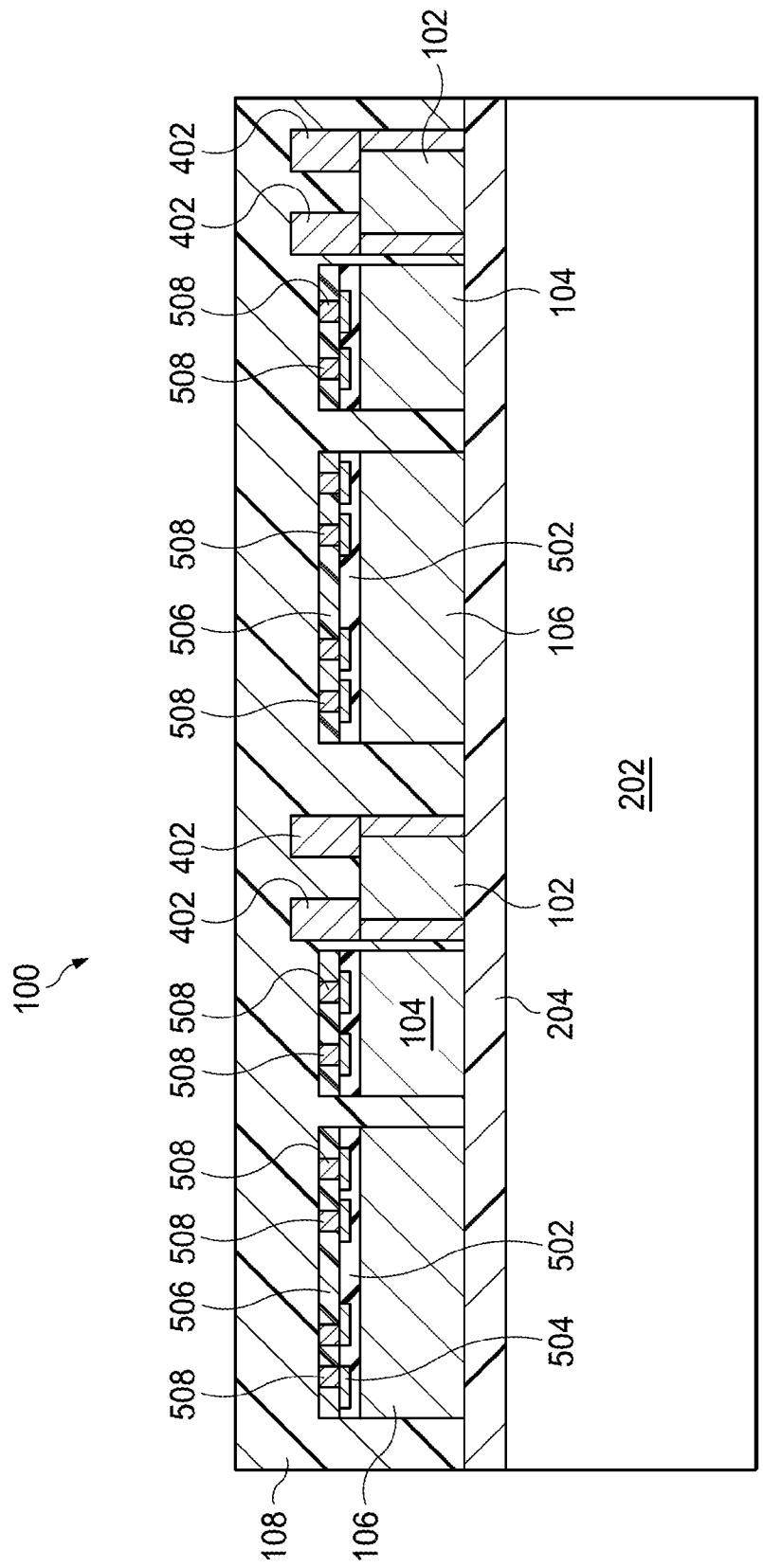
FIG. 6 illustrates a cross sectional view of the semiconductor device shown in FIG. 5 after a molding compound layer is formed over the carrier in accordance with various embodiments of the present disclosure.

FIG. 6 illustrates a cross sectional view of the semiconductor device shown in FIG. 5 after a molding compound layer is formed over the carrier in accordance with various embodiments of the present disclosure. The molding compound layer 108 is formed over the carrier 202 as shown in FIG. 6. After the molding compound layer 108 is formed, the semiconductor dies 104 and 106 as well as the surface-mount devices 102 and the metal pillars are embedded in the molding compound layer 108.

In accordance with some embodiments, the molding compound layer 108 may be formed of suitable underfill materials such as an epoxy, which is dispensed at the gaps between the surface-mount devices 102, and the semiconductor dies 104 and 106. The epoxy may be applied in a liquid form, and may harden after a curing process.

In alternative embodiments, the molding compound layer 108 may be formed of curable materials such as polymer based materials, resin based materials, polyimide, epoxy and any combinations of thereof. The molding compound layer 108 can be formed by any suitable dispense techniques.

Figure 7:
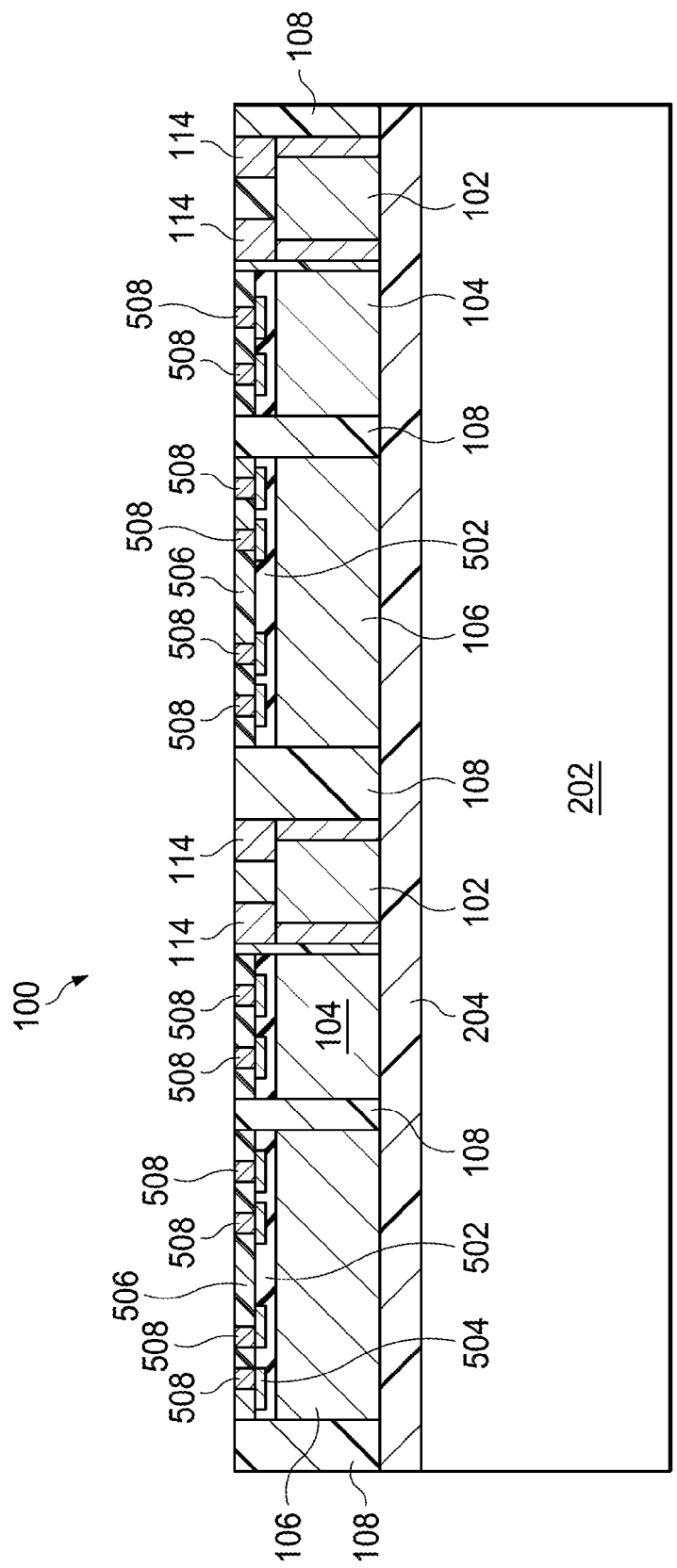
FIG. 7 illustrates a cross sectional view of the semiconductor device shown in FIG. 6 after a grinding process is applied to the top surface of the molding compound layer in accordance with various embodiments of the present disclosure.

FIG. 7 illustrates a cross sectional view of the semiconductor device shown in FIG. 6 after a grinding process is applied to the top surface of the molding compound layer in accordance with various embodiments of the present disclosure. The top surface of the molding compound layer 108 undergoes a grinding process. The grinding process can employ a mechanical grinding process, a chemical polishing process, an etching process, any combinations thereof and/or the like.

As shown in FIG. 7, the grinding process is applied to the top surface of the molding compound layer 108 until the top surfaces of the semiconductor dies 104 and 106 become exposed. In particular, the top surfaces of the vias of the semiconductor dies 104 and 106 are exposed outside the molding compound layer 108. In addition, portions of the metal pillars 402 (shown in FIG. 4) may be removed to form metal pillars 114. As shown in FIG. 7, one terminal of the metal pillar 114 is exposed outside the molding compound layer 108 and level with the top surfaces of the semiconductor dies 104 and 106.

Figure 8:
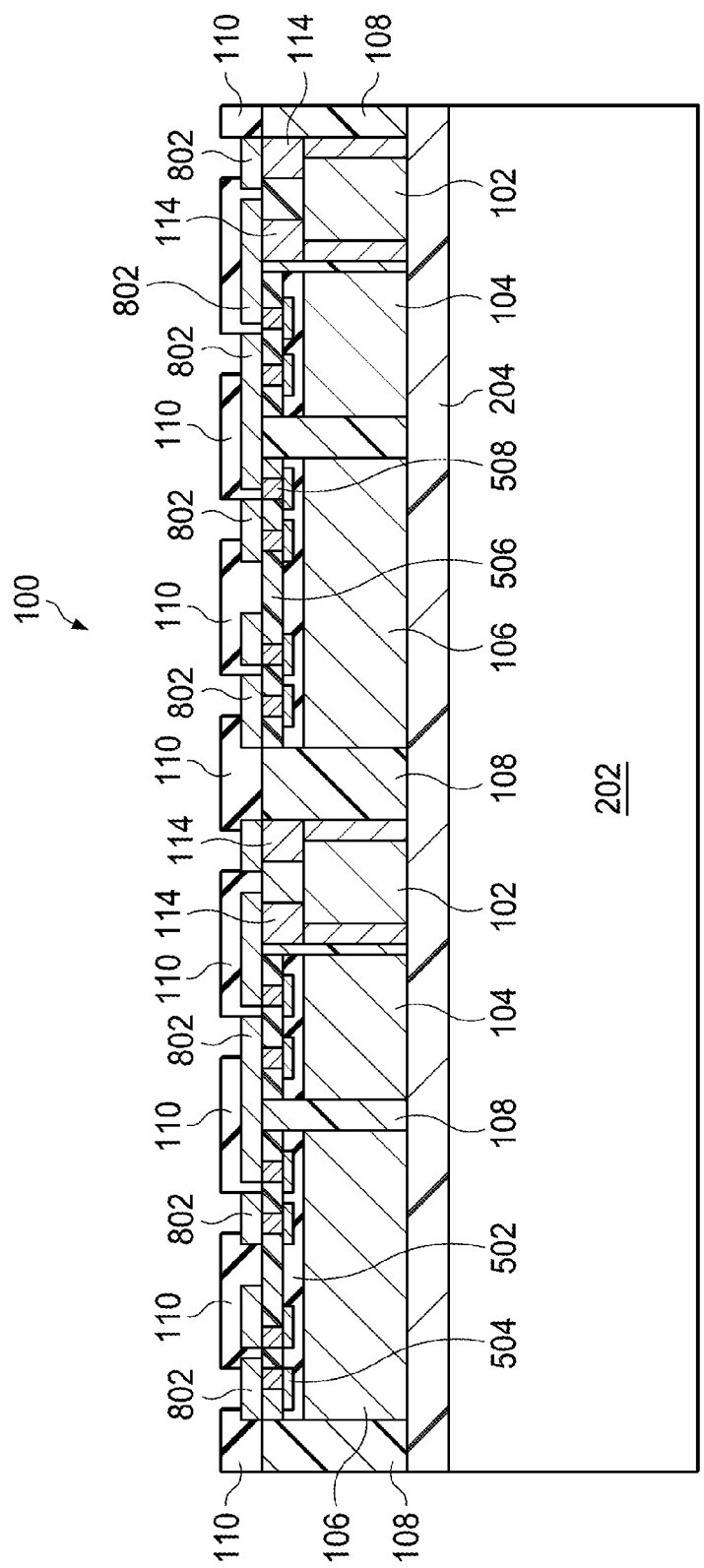
FIG. 8 illustrates a cross sectional view of the semiconductor device shown in FIG. 7 after a plurality of interconnect structures are formed over the molding compound layer in accordance with various embodiments of the present disclosure.

FIG. 8 illustrates a cross sectional view of the semiconductor device shown in FIG. 7 after a plurality of interconnect structures are formed over the molding compound layer in accordance with various embodiments of the present disclosure. The interconnect structures 110 are formed over the molding compound layer. In particular, the interconnect structures 110 are electrically coupled to the semiconductor dies through the vias of the semiconductor dies. In addition, the interconnect structures 110 are electrically coupled to the surface-mount devices 102 through metal pillars 114.

The interconnect structures 110 may include a dielectric layer and a redistribution layer. The dielectric layer may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like. The dielectric layer may be formed by any suitable method known in the art, such as spinning, CVD, plasma enhanced CVD (PECVD) and/or the like.

The redistribution layer 802 may be a single material layer, or a multi-layered structure and may be made of metals such as titanium, titanium nitride, aluminum, tantalum, copper and combinations thereof. The redistribution layer may be made by any suitable method known in the art such as physical vapor deposition (PVD), sputter, CVD, electroplating and/or the like.

This interconnect structure shown in FIG. 8 is merely an example, which should not unduly limit the scope of the claims. One of ordinary skill in the art would recognize many variations, alternatives, and modifications. For example, the interconnect structure may comprise a plurality of dielectric layers. In particular, the interconnect structure may be formed by alternating layers of dielectric (e.g., extremely low-k dielectric material) and conductive materials (e.g., copper).

Figure 9:
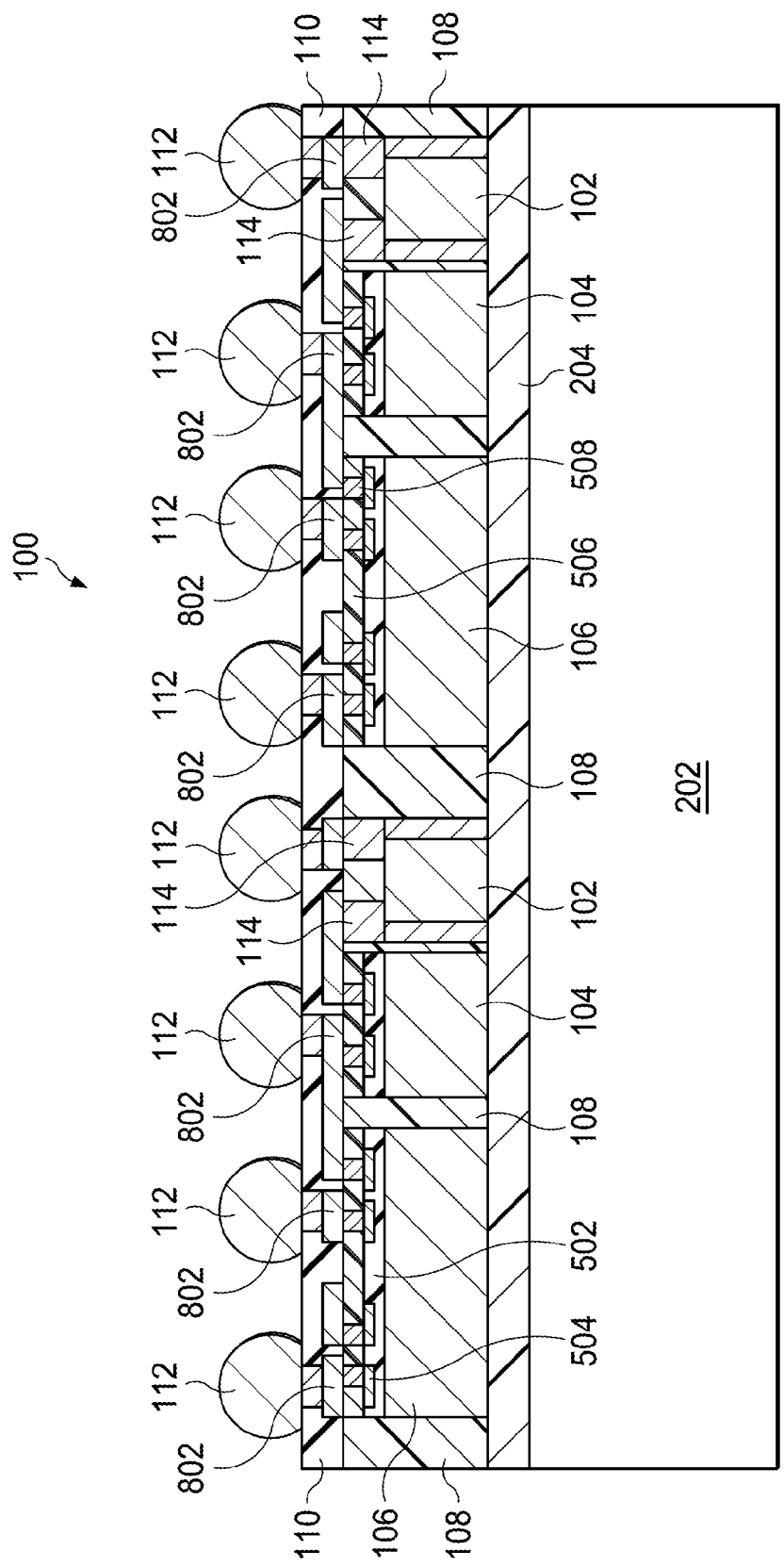
FIG. 9 illustrates a cross sectional view of the semiconductor device shown in FIG. 8 after a plurality of under bump metallization (UBM) structures and bumps are formed in accordance with various embodiments of the present disclosure.

FIG. 9 illustrates a cross sectional view of the semiconductor device shown in FIG. 8 after a plurality of UBM structures and bumps are formed in accordance with various embodiments of the present disclosure. The plurality of UBM structures (not shown) are formed over the redistribution layer of the interconnect structures 110. The UBM structures help to prevent diffusion between the solder balls and the integrated circuits of the semiconductor device, while providing a low resistance electrical connection.

The bumps 112 are input/output (I/O) pads or interconnection bumps of the semiconductor device. In some embodiments, the bumps 112 may be formed of copper. In accordance with another embodiment, the bumps 112 may be a plurality of solder balls. In some embodiments, the solder balls may comprise SAC405. SAC405 comprises 95.5% Sn, 4.0% Ag and 0.5% Cu.

FIG. 10 illustrates a process of removing the carrier from package-to-package semiconductor device in accordance with various embodiments of the present disclosure. In accordance with some embodiments, the carrier 202 can be detached from the multi-chip semiconductor device 100. A variety of detaching processes may be employed to separate the multi-chip semiconductor device 100 from the carrier 202. The variety of detaching processes may comprise a chemical solvent, a UV exposure, a laser ablation process, any combinations thereof and/or the like.

FIG. 11 illustrates a cross sectional view of the semiconductor device shown in FIG. 10 after a dicing process is applied to the semiconductor device in accordance with various embodiments of the present disclosure. A suitable dicing process may be employed to separate the multi-chip semiconductor device 100 into a plurality of individual fan-out packages (as shown in FIG. 1). The dicing process is well known in the art, and hence is not discussed in detail herein to avoid repetition.

In accordance with an embodiment, a device comprises a first semiconductor die embedded in a molding compound layer, a surface-mount device embedded in the molding compound layer, a plurality of interconnect structures formed on the molding compound layer, wherein the first semiconductor die is electrically coupled to the interconnect structures and the surface-mount device is electrically coupled to the interconnect structures through at least a metal pillar and a plurality of bumps formed on and electrically coupled to the interconnect structures.

In accordance with an embodiment, a method comprises attaching a surface-mount device on a carrier through an adhesive layer, wherein the surface-mount device has two contacts, applying a metal-paste printing process to the surface-mount device, applying a reflow process to form a plurality of metal pillars on the contacts of the surface-mount device, attaching a first semiconductor die on the carrier through the adhesive layer, forming a molding compound layer over the carrier, wherein the first semiconductor die and the surface-mount device are embedded in the molding compound layer, grinding the molding compound layer until a top surface of the first semiconductor die is exposed, forming a plurality of interconnect structures over the molding compound layer and mounting a plurality of bumps on the interconnect structures to form a multi-chip semiconductor device.

In accordance with an embodiment, a method comprises attaching a plurality of surface-mount devices on a carrier through an adhesive layer, wherein each surface-mount device has two contacts, printing metal paste on the contacts, reflowing the metal paste to form a plurality of metal pillars, attaching a plurality of semiconductor dies on the carrier through the adhesive layer to form a first group of semiconductor devices and a second group of semiconductor devices, wherein the first group comprises at least a first semiconductor die and a first surface-mount device and the second group comprises at least a second semiconductor die and a second surface-mount device.

The method further comprises forming a molding compound layer over the carrier, wherein the first group of semiconductor devices and the second group of semiconductor devices are embedded in the molding compound layer, grinding the molding compound layer until a top surface of the first semiconductor die and the second semiconductor die are exposed and forming a plurality of interconnect structures over the molding compound layer.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:
1. A method comprising:
  attaching a surface-mount device on a carrier through an adhesive layer, wherein the surface-mount device has two contacts;
  applying a metal-paste printing process to the surface-mount device;
  applying a reflow process to form a plurality of metal pillars on the contacts of the surface-mount device;
  attaching a first semiconductor die on the carrier through the adhesive layer;
  forming a molding compound layer over the carrier, wherein the first semiconductor die and the surface-mount device are embedded in the molding compound layer;
  grinding the molding compound layer until a top surface of the first semiconductor die is exposed;
  forming a plurality of interconnect structures over the molding compound layer; and
  mounting a plurality of bumps on the interconnect structures to form a multi-chip semiconductor device.

2. The method of claim 1, further comprising:
removing the carrier from the multi-chip semiconductor device through suitable detaching processes.

3. The method of claim 1, further comprising:
disposing a photo resist layer over the carrier;
patterning the photo resist layer to form a plurality of pillar-shaped openings over the contacts of the surface-mount device; and
filling the openings with solder materials.

4. The method of claim 3, further comprising:
after the step of filling the opening with solder materials, reflowing the solder materials to form a plurality of metal pillars; and
removing the photo resist layer to expose the metal pillars.

5. The method of claim 1, further comprising:
attaching a second semiconductor die on the carrier through the adhesive layer, wherein the second semiconductor die is of a same height as the first semiconductor die.

6. A method comprising:
attaching a plurality of surface-mount devices on a carrier through an adhesive layer, wherein each surface-mount device has two contacts;
printing metal paste on the contacts;
reflowing the metal paste to form a plurality of metal pillars;
attaching a plurality of semiconductor dies on the carrier through the adhesive layer to form a first group of semiconductor devices and a second group of semiconductor devices, wherein:
the first group comprises at least a first semiconductor die and a first surface-mount device; and
the second group comprises at least a second semiconductor die and a second surface-mount device;
forming a molding compound layer over the carrier, wherein the first group of semiconductor devices and the second group of semiconductor devices are embedded in the molding compound layer;
grinding the molding compound layer until a top surface of the first semiconductor die and the second semiconductor die are exposed; and
forming a plurality of interconnect structures over the molding compound layer.

7. The method of claim 6, wherein:
the first semiconductor die and the second semiconductor die are of a same height.

8. The method of claim 6, further comprising:
detaching the carrier from the molding compound layer.

9. The method of claim 6, further comprising:
providing a semiconductor wafer comprising a plurality of semiconductor dies; and
sawing the semiconductor wafer to form the first semiconductor die and the second semiconductor die.

10. The method of claim 6, further comprising:
disposing a photo resist layer over the carrier;
patterning the photo resist layer to form a plurality of pillar-shaped openings over the contacts of the surface-mount device;
filling the openings with solder materials;
reflowing the solder materials to form a plurality of metal pillars; and
removing the photo resist layer to expose the metal pillars.

11. The method of claim 6, further comprising:
mounting a plurality of bumps on the interconnect structures.

12. The method of claim 6, further comprising:
applying a dicing process to form a first multi-chip semiconductor device comprising the first group of semiconductor devices and a second multi-chip semiconductor device comprising the second group of semiconductor devices.

13. A method comprising:
forming a glue layer on a carrier;
attaching a passive component on the glue layer;
printing a solder paste layer on the passive component;
mounting a first semiconductor chip on the carrier, wherein a top surface of the solder paste layer is higher than a top surface of the first semiconductor chip;
forming a molding compound layer over the carrier, wherein the first semiconductor chip and the passive component are embedded in the molding compound layer;
applying a grinding process to the molding compound layer until the top surface of the solder paste layer is level with the top surface of the first semiconductor chip; and
forming interconnect structures over the molding compound layer, wherein the interconnect structures are electrically coupled to the first semiconductor chip and the passive component.

14. The method of claim 13, further comprising:
attaching a second semiconductor chip on the carrier, wherein the second semiconductor chip is of a same height as the first semiconductor chip.

15. The method of claim 13, wherein:
the passive component has two contacts.

16. The method of claim 15, further comprising:
applying a reflow process to the solder paste layer to form two pillars on the contacts of the passive component.

17. The method of claim 13, further comprising:
forming a plurality of bumps over the interconnect structures to form a multi-chip semiconductor device.

18. The method of claim 17, further comprising:
detaching the multi-chip semiconductor device from the carrier.

19. The method of claim 13, wherein:
the interconnect structures comprise a plurality of redistribution lines.

20. The method of claim 13, wherein:
the passive component is selected from the group consisting of capacitors, resistors and inductors.

* * * * *